(12) United States Patent
Fukuda et al.

(10) Patent No.: US 6,747,203 B2
(45) Date of Patent: Jun. 8, 2004

(54) PHOTOVOLTAIC MODULE

(75) Inventors: Yukio Fukuda, Kashiba (JP); Akimasa Umemoto, Sakurai (JP); Noriaki Shibuya, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 43 days.

(21) Appl. No.: 10/191,800

(22) Filed: Jul. 10, 2002

(65) Prior Publication Data

US 2003/0010377 A1 Jan. 16, 2003

(30) Foreign Application Priority Data

Jul. 13, 2001 (JP) ........................................ 2001-213917

(51) Int. Cl.$^7$ ............................................. H01L 31/048
(52) U.S. Cl. ...................... 136/251; 136/244; 136/256; 257/433; 257/788; 257/789; 257/790
(58) Field of Search ..................... 136/251, 244, 136/256; 257/433, 788, 789, 790; 438/64, 66, 80

(56) References Cited

U.S. PATENT DOCUMENTS

| | | | | |
|---|---|---|---|---|
| 5,807,440 A | * | 9/1998 | Kubota et al. | 136/256 |
| 6,335,479 B1 | * | 1/2002 | Yamada et al. | 136/251 |
| 6,380,478 B1 | * | 4/2002 | Yamamoto et al. | 136/244 |
| 6,570,223 B1 | * | 5/2003 | Machida et al. | 257/347 |
| 2002/0020440 A1 | * | 2/2002 | Yoshimine et al. | 136/251 |
| 2003/0178056 A1 | * | 9/2003 | Hikosaka et al. | 136/251 |

FOREIGN PATENT DOCUMENTS

| | | | |
|---|---|---|---|
| JP | 10-256580 | | 9/1998 |
| JP | 2001-156313 A | * | 6/2001 |
| JP | 2001-257372 | | 9/2001 |

* cited by examiner

*Primary Examiner*—Alan Diamond
(74) *Attorney, Agent, or Firm*—Nixon & Vanderhye P.C.

(57) ABSTRACT

A photovoltaic module including: a light-transmissive substrate; a first sealing polymer layer stacked on the substrate; a photovoltaic cell stacked on the first sealing polymer layer; a second sealing polymer layer stacked on the photovoltaic cell and a weatherproof film stacked on the second sealing polymer layer, wherein the weatherproof film includes a moisture-proof layer provided on the second sealing polymer layer and a gas-proof layer provided on the moisture-proof layer, the gas-proof layer being made of polyphenylene sulfide.

7 Claims, 7 Drawing Sheets

PHOTOVOLTAIC MODULE

CROSS-REFERENCE TO RELATED APPLICATION

This application is related to Japanese Patent Application No. 2001-213917 filed on Jul. 13, 2001, whose priority is claimed under 35 USC §119, the disclosure of which is incorporated by reference in its entirety.

BACKGROUND OF THE INVENTION

1. Field of the Invention

The present invention relates to a photovoltaic module. More specifically, it relates to a photovoltaic module capable of withstanding harsh environments such as volcanic areas, hot spring areas and water purification and sewage treatment facilities.

2. Description of Related Art

Photovoltaic modules utilized in a residential photovoltaic power generation system and an independent power source system are required to have long-term reliability.

Therefore, mostly utilized is a photovoltaic module of a super-straight structure composed of a sealing polymer layer (ethylene-vinylacetate copolymer: EVA) on the light receiving surface side, a photovoltaic cell, a sealing polymer layer (EVA) on the rear surface side and a weatherproof film for sealing the rear surface side which are stacked in this order on a light receiving glass and integrated by lamination (see, for example, Japanese Unexamined Patent Publication No. Hei 10 (1998)-256580).

In connection with the widespread use of the residential photovoltaic modules, industrial photovoltaic modules are also coming into wide use for buildings, warehouses, gymnasiums and public buildings of large capacity.

Features of the industrial photovoltaic module are that it generates as large power as 10 kW or more in comparison with 3 kW of the residential photovoltaic module and occupies a larger area. Further, the industrial photovoltaic module is installed in harsh outdoor environments, e.g., areas suffering from salt damage such as at seaside and at sea, areas exposed to sulfide gas such as volcanic areas and hot spring areas and places exposed to chlorine gas or sulfide gas such as water purification and sewage treatment facilities, and therefore it needs to be resistant against such environments.

For the photovoltaic module installed in the salt damage area, measures against electrolytic corrosion are taken.

The object of taking such measures is to prevent the electrolytic corrosion caused by adhesion of salt contained in the sea breeze to a gap between a frame which constitutes the photovoltaic module (generally an aluminum frame) and a tapping screw which secures the frame (generally made of stainless steel).

More specifically, a nonmetal insulating washer is fitted to the tapping screw and then the frame is secured with the tapping screw. Then, an exposed surface of the screw is sealed with a silicon polymer, a section of the frame is anodized to prevent contact with outside air and the gap between the frame and the photovoltaic module is filled with a silicon polymer. Then, the photovoltaic module is fixed to a steel pedestal with a bolt fitted with a nonmetal insulating washer. Thus, the electrolytic corrosion is prevented. This technique has been widely accepted in the market.

The above-mentioned measures against the electrolytic corrosion are solely directed to the photovoltaic module installed at seaside or at sea, and not to the one installed in the area exposed to sulfide gas or chlorine gas such as volcanic areas, hot spring areas and water purification and sewage treatment facilities.

In order to install the photovoltaic module in the volcanic areas or hot spring areas, measures should be taken to cope with the exposure to poisonous gases such as hydrogen sulfide gas ($H_2S$) and chlorine gas ($Cl_2$).

Further, in the water purification and sewage treatment facilities, measures should be taken against the exposure to poisonous gases such as hydrogen sulfide gas ($H_2S$), chlorine gas ($Cl_2$), methylmercaptan ($CM_3SH$), methyl sulfide (($CH_3)_2S$) and ammonia ($NH_3$).

In the ordinary photovoltaic modules including the above-mentioned one which is manufactured in view of the salt damage, a PET film is generally utilized as a rear surface sealing weatherproof film.

However, the weatherproof film which is solely made of PET allows vapor to permeate. The vapor permeated through the PET film also penetrates a rear surface sealing polymer layer (EVA layer) to deteriorate the characteristics of the photovoltaic cell.

Therefore, also utilized is a rear surface sealing weatherproof film of a three-layer structure in which a metal layer or an inorganic oxide layer is sandwiched between the PET films (see, for example, Japanese Unexamined Patent Publication No 2001-257372).

That is, the metal layer or the inorganic oxide layer which does not allow the vapor permeation is provided as a moisture-proof layer and the PET films are formed to sandwich the moisture-proof layer. This three-layer structure enhances vapor impermeability of the rear surface sealing weatherproof film.

However, the PET film includes an ester bond in its structure. Therefore, if the PET film is exposed to a complex environment in which poisonous gases such as hydrogen sulfide gas, chlorine gas, methylmercaptan, methyl sulfide and ammonia exist together or these gases and vapor are mixed, hydrolysis reaction occurs to increase carboxylic acid groups in the ester bond. This deteriorates the PET film and finally decreases the mechanical strength of the film, thereby the film may be exfoliated or cracked.

When the PET film is exfoliated or cracked, the moisture-proof function of the rear surface sealing weatherproof film is considerably impaired as a matter of course, which results in the deterioration of the characteristics of the photovoltaic module.

Therefore, in order to install the photovoltaic module in the volcanic areas, hot spring areas and water purification and sewage treatment facilities, measures should be taken against the exposure to the above-mentioned poisonous gases.

SUMMARY OF THE INVENTION

Under the above-mentioned circumstances, the present invention has been achieved to provide a photovoltaic module which can be used without any characteristic deterioration even if it is installed in a place exposed to poisonous gases such as hydrogen sulfide gas, chlorine gas, methylmercaptan, methyl sulfide and ammonia.

In another aspect, the photovoltaic module according to the present invention allows the installation of the photovoltaic module in harsh outdoor environments that have been given a wide berth, for example, volcanic areas, hot spring areas and water purification and sewage treatment facilities, thereby contributing to the dissemination of the photovoltaic module and increasing an industrial demand thereof.

The present invention provides a photovoltaic module comprising: a light-transmissive substrate; a first sealing polymer layer stacked on the substrate; a photovoltaic cell stacked-on the first sealing polymer layer; a second sealing polymer layer stacked on the photovoltaic cell and a weatherproof film stacked on the second sealing polymer layer, wherein the weatherproof film includes a moisture-proof layer provided on the second sealing polymer layer and a gas-proof layer provided on the moisture-proof layer, the gas-proof layer being made of polyphenylene sulfide.

Specifically, the photovoltaic module according to the present invention includes, as an outermost layer of the weatherproof film, a polyphenylene sulfide (PPS) layer having excellent resistance against hydrogen sulfide gas, chlorine gas, methylmercaptan, methyl sulfide and ammonia that are generated in the volcanic areas, hot spring areas and water purification and sewage treatment facilities. This structure prevents the deterioration of the moisture-proof layer formed below the gas-proof layer.

As a result, the present invention provides a photovoltaic module which can be used without any characteristic deterioration even if it is installed in a place exposed to the above-mentioned poisonous gases or these gases and vapor.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
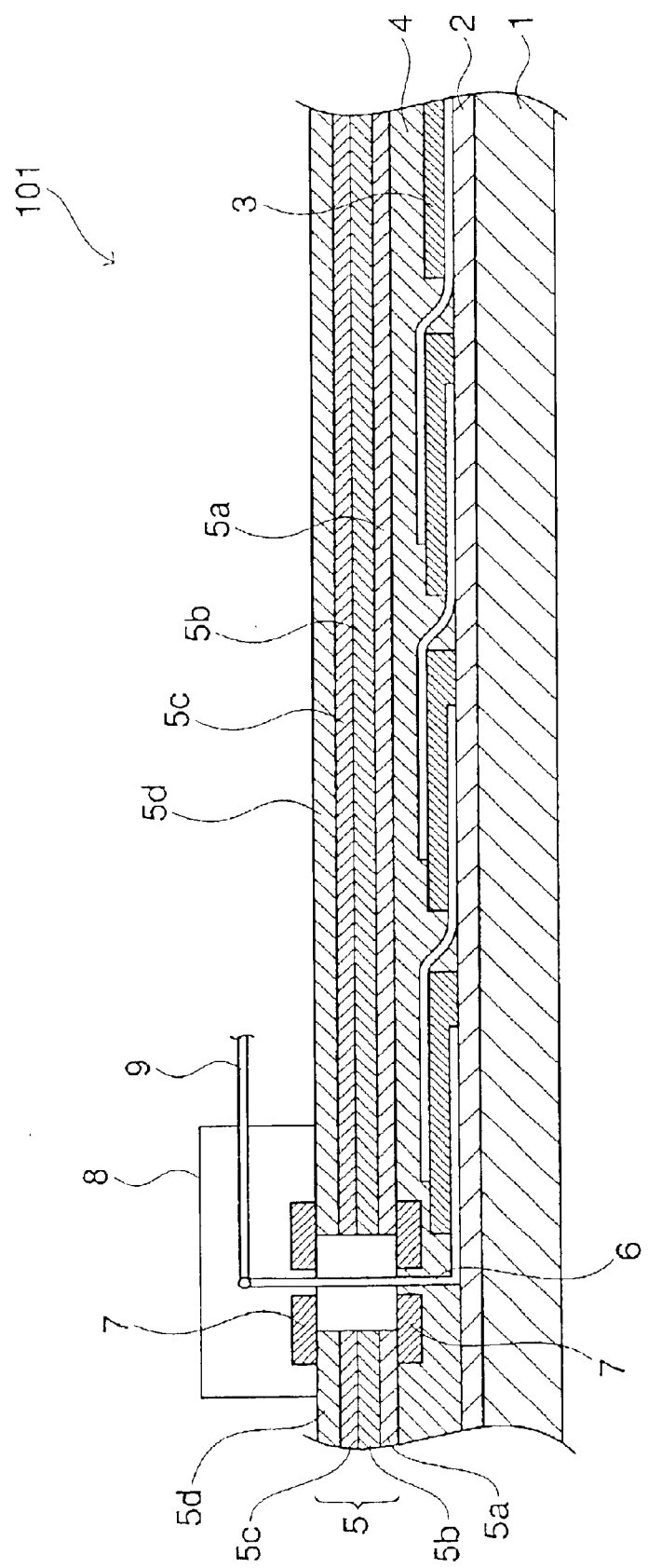
FIG. 1 is a sectional view illustrating a photovoltaic module according to Embodiment 1 of the present invention.

The photovoltaic module according to the present invention is characterized by comprising a light-transmissive substrate; a first sealing polymer layer stacked on the substrate; a photovoltaic cell stacked on the first sealing polymer layer; a second sealing polymer layer stacked on the photovoltaic cell and a weatherproof film stacked on the second sealing polymer layer, wherein the weatherproof film includes a moisture-proof layer provided on the second sealing polymer layer and a gas-proof layer provided on the moisture-proof layer, the gas-proof layer being made of polyphenylene sulfide.

According to the photovoltaic module of the present invention, material and thickness of the light-transmissive substrate are not particularly limited as long as it has the same weatherproof property as that of the weatherproof film. For example, a glass substrate having a thickness of about 2 to 5 mm may be used.

According to the photovoltaic module of the present invention, material and thickness of the first and second sealing polymer layers are not particularly limited as long as they are adhesive polymer layers. For example, the first and second sealing polymer layers may be made of ethylene-vinylacetate copolymer (EVA) having a thickness of about 0.1 to 1 mm.

According to the photovoltaic module of the present invention, the photovoltaic cell signifies a cell in which electrode layers are provided on a light receiving surface and a rear surface of a photoelectric conversion layer, respectively. The photovoltaic cell may be formed of a single cell or a plurality of cells which are connected in series to obtain a voltage required for its application.

Material for the photoelectric conversion layer is not particularly limited as long as it has a photoelectric conversion function. For example, the photoelectric conversion layer may be made of crystalline material such as crystalline silicon. In the case of connecting the cells in series, wiring may be provided by any methods without any limitations.

According to the present invention, the photovoltaic module signifies a photovoltaic cell sealed in a vessel or a polymer for protection from moisture, dust, collision of gravels, wind pressure and the like, or the sealed photovoltaic cell surrounded with a frame.

According to the photovoltaic module of the present invention, the moisture-proof layer is preferably made of a metal or an inorganic oxide.

This is because the metal layer or the inorganic oxide layer has excellent vapor impermeability.

Especially, it is advantageous to utilize a non-conductive inorganic oxide layer as the moisture-proof layer because it eliminates the need to insulate a portion of the weatherproof film through which a lead wire is taken out of the photovoltaic cell.

According to the photovoltaic module of the present invention, the metal layer which may be used as the moisture-proof layer is preferably made of aluminum or galvanized steel.

If aluminum is used to form the metal layer, the manufacturing cost can be restrained to the same level as that of the conventional moisture-proof layer. Further, if galvanized steel is used to form the metal layer, fireproof performance required by the Building Standard Law for an integral rooftop photovoltaic module can be satisfied.

According to the photovoltaic module of the present invention, the inorganic oxide layer which may be used as the moisture-proof layer is preferably made of silica ($SiO_2$-$\Delta$), titania ($TiO_2$-$\Delta$) or zirconia ($ZrO_2$-$\Delta$).

This is because silica, titania or zirconia can easily be formed into the moisture-proof layer by evaporation method instead of the metal layer.

Every material mentioned above includes $O_2$-$\Delta$. This signifies that oxygen deficiency of oxides thereof is non-stoichiometry. The oxygen deficiency is not particularly limited as long as it is in the range of $0<\Delta\leq2$.

According to the photovoltaic module of the present invention, the moisture-proof layer may further provides a polyethylene terephthalate (PET) layers on both surfaces thereof.

With this structure, conventional techniques can be utilized without any alteration. For example, the PET layer contacting the second sealing polymer layer can be colored in white so that a solar beam is reflected and scattered to increase the amount of light incident on the photovoltaic cell. Alternatively, the same PET layer can be colored in black to improve the design of the photovoltaic module.

According to the photovoltaic module of the present invention, the moisture-proof layer may further provides a PPS layer adjacent to the second sealing polymer layer.

With this structure, the kind of organic film used in the weatherproof film is limited to one, which inhibits an increase in cost of manufacturing the weatherproof film.

However, the PPS layer itself is semitransparent or brown-colored and cannot be dyed. Therefore, it is impossible to adopt the above-mentioned techniques for increasing the amount of the incident light by coloring it in white or improving the design of the photovoltaic module by coloring it in black.

The weatherproof film of the photovoltaic module according to the present invention, the moisture-proof layer and the gas-proof layer may be adhered by an ethylene-vinylacetate copolymer layer sandwiched therebetween.

With this structure, the weatherproof film can be manufactured by suitably adhering the gas-proof layer to the moisture-proof layer.

That is, if the structure of the moisture-proof layer is the same as that of a conventional weatherproof film, the gas-proof layer can suitably be adhered to the conventional weatherproof film to give a resistance against poisonous gas to the weatherproof film.

This signifies that the conventional weatherproof film can appropriately be changed to a weatherproof film having the resistance against poisonous gas and the vapor impermeability in accordance with a market demand.

Further, this allows the manufacture of the weatherproof film having the resistance against poisonous gas and the vapor impermeability without preparing a special manufacturing apparatus. Therefore, an increase in manufacturing cost required for giving the resistance against poisonous gas to the conventional weatherproof film can be prevented.

In another aspect, the present invention provides a photovoltaic module comprising: a light-transmissive substrate; a light-transmissive first electrode layer stacked on the substrate; a photoelectric conversion layer stacked on the first electrode layer; a second electrode layer stacked on the photoelectric conversion layer; a sealing polymer layer stacked on the second electrode layer and a weatherproof film stacked on the sealing polymer layer, wherein the weatherproof film includes a moisture-proof layer provided on the sealing polymer layer and a gas-proof layer provided on the moisture-proof layer, the gas-proof layer being made of polyphenylene sulfide.

Regarding the above-mentioned photovoltaic module, material and thickness of the light-transmissive substrate are not particularly limited as long as it has the same weatherproof property as that of the weatherproof film. For example, a glass substrate having a thickness of about 2 to 5 mm may be used.

Material and thickness of the first electrode layer are not particularly limited as long as it is a transparent conductive layer. For example, a transparent conductive film of $SnO_2$ or $ZnO_2$ having a thickness of about 0.1 to 2 $\mu$m may be used.

Material for the photoelectric conversion layer is not particularly limited as long as it has a photoelectric conversion function. For example, a thin film made of P-type, I-type and N-type amorphous semiconductors stacked in this order may be used.

The second electrode layer may be the same transparent conductive film as that used for the first electrode layer. However, in view of photoelectric conversion efficiency, the second electrode layer is preferably a thin metal film of about 0.1 to 2 $\mu$m thick made of silver, aluminum, copper or an alloy thereof so that light entered from the substrate side can be reflected toward the photoelectric conversion layer.

Material and thickness of the sealing polymer layer are not particularly limited as long as it is an adhesive polymer layer. For example, EVA having a thickness of about 0.1 to 1 mm may be used.

The weatherproof film may be the same as the above-mentioned one. The effects of the weatherproof film are also the same as described above.

According to the photovoltaic module of the present invention, techniques for forming the layers comprising the weatherproof film are not particularly limited and known techniques can be used. For example, may be used a technique for applying the layer materials sequentially or a technique for stacking films made of the layer materials in sequence and integrating them thereafter.

In the case of utilizing the latter technique, the integration of the films may be performed by a known technique without particular limitation. For example, dry lamination method may be used.

The thicknesses of the layers comprising the weatherproof film are not particularly limited and may optionally be determined with reference to those described in Embodiments below. For example, a polyphenylene sulfide layer used as the gas-proof layer may have a thickness of about 10 $\mu$m or more, preferably about 30 $\mu$m or more, more preferably about 40 $\mu$m or more.

EMBODIMENTS

Hereinafter, the present invention will be detailed by way of Embodiments with reference to the figures. However, the invention is not limited thereto. Components that are common in the Embodiments below are given with the same reference numerals.

Embodiment 1

A photovoltaic module according to Embodiment 1 is described with reference to FIG. 1. FIG. 1 is a sectional view illustrating the photovoltaic module according to Embodiment As shown in FIG. 1, a photovoltaic module 101 according to Embodiment 1 includes a glass substrate 1, a first sealing polymer layer 2 stacked on the glass substrate 1, photovoltaic cells 3 stacked on the first sealing polymer layer 2, a second sealing polymer layer 4 stacked on the photovoltaic cells 3 and a weatherproof film 5 stacked on the second sealing polymer layer 4. The weatherproof film 5 includes a thin aluminum film 5*b* provided on the second sealing polymer layer 4 as a moisture-proof layer and a PPS film 5*d* provided on the thin aluminum film 5*b* as a gas-proof layer.

Specifically, as shown in FIG. 1, on the glass substrate 1 made of white tempered glass of about 3.2 mm thick, EVA of about 0.6 mm thick is stacked as the first sealing polymer layer 2 and the photovoltaic cells 3 connected in series are mounted on the first sealing polymer layer 2. The photovoltaic cells 3 are made of crystalline silicon.

On the photovoltaic cells 3, EVA of about 0.4 mm. thick is stacked as the second sealing polymer layer 4 and the weatherproof film 5 is stacked on the second sealing polymer layer 4.

The weatherproof film 5 is composed of a PET film 5a of about 50 μm thick, a thin aluminum film 5b of about 7 μm thick, a PET film 5c of about 50 μm thick and a PPS film 5d of about 50 μm thick which are stacked in this order on the second sealing polymer layer 4 and integrated by dry lamination method.

Thereafter, the glass substrate 1, the first sealing polymer layer 2, the photovoltaic cells 3, the second sealing polymer layer 4 and the weatherproof film 5 stacked as described above are integrated by a known sealing technique, for example, an autoclave method or a vacuum lamination method. At this time, a cross-linking reaction proceeds in EVA comprising the first and second sealing polymer layers 2 and 4. The integration is completed when the reaction is finished.

Then, a frame (not shown) is attached to the photovoltaic module 101 by a conventional technique.

At this time, measures same as those which have conventionally been adopted against salt damage are taken. That is, a nonmetal washer is fitted to a tapping screw, an exposed portion of the tapping screw is sealed with a silicon polymer, a section of the frame is anodized and a gap between the photovoltaic module and the frame is filled with a silicon polymer.

In the final step, a lead wire 6 is taken out of the photovoltaic cells 3 via the weatherproof film 5. Since the thin aluminum film 5b is utilized as the moisture-proof layer in the weatherproof film 5, a portion of the weatherproof film 5 through which the lead wire 6 will be taken out is insulated by using Kapton rings 7 before the lead wire 6 is taken out.

The thus taken-out lead wire 6 is introduced into a terminal box 8 and connected with an external output cable 9.

The thus manufactured super straight type photovoltaic module 101 does not cause electrolytic corrosion even if it is installed in the salt damage area. Further, the PPS film 5d protects the PET film 5c from poisonous gases such as hydrogen sulfide gas, chlorine gas, methylmercaptan, methyl sulfide and ammonia, so that the photovoltaic module 101 can be used without any characteristic deterioration even if it is placed in environments exposed to the poisonous gases or the poisonous gases and vapor.

Therefore, the photovoltaic module 101 can be installed in any places. such as the salt damage areas, volcanic areas, hot spring areas and water purification and sewage treatment facilities.

Embodiment 2

Figure 2:
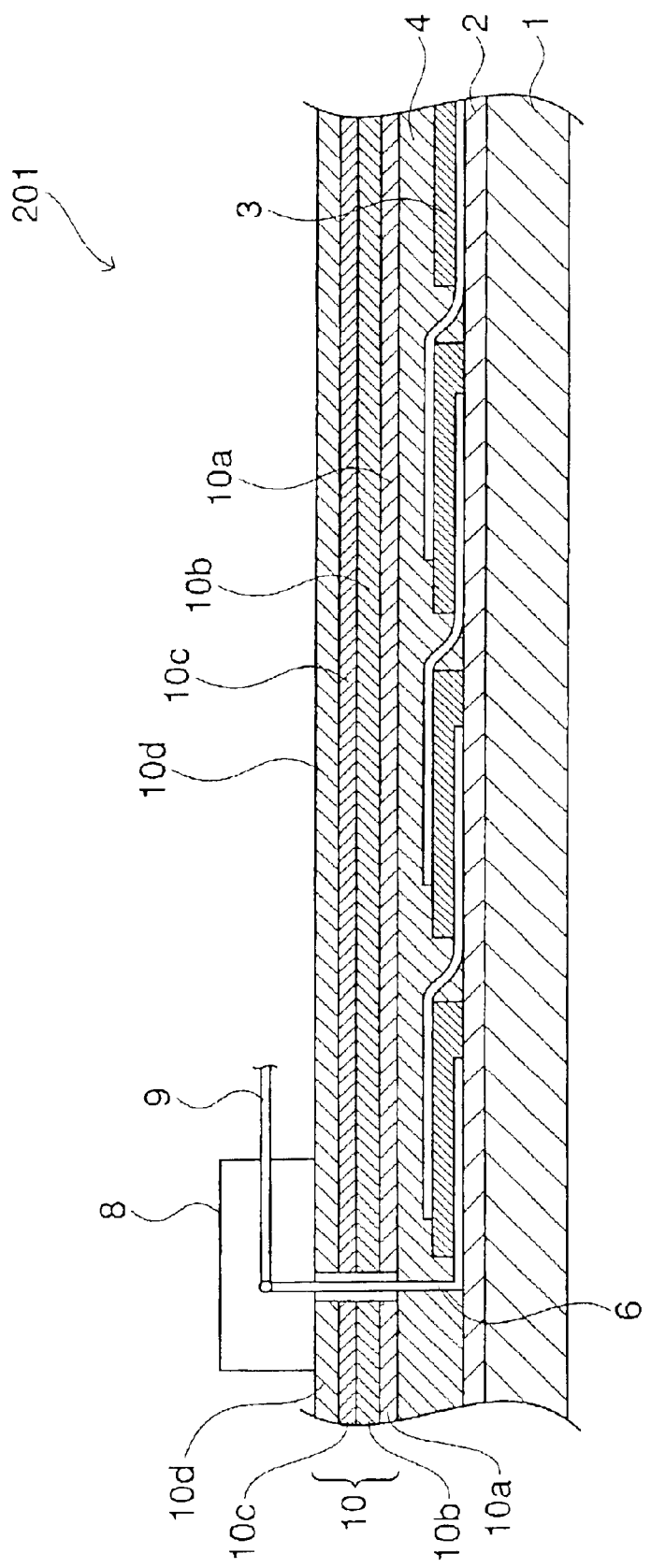
FIG. 2 is a sectional view illustrating a photovoltaic module according to Embodiment 2 of the present invention.

A photovoltaic module according to Embodiment 2 of the present invention is described with reference to FIG. 2. FIG. 2 is a sectional view illustrating the photovoltaic module according to Embodiment 2.

Difference between the photovoltaic module of Embodiment 2 and that of Embodiment 1 (see FIG. 1) is only the structure of the weatherproof film and the other components are the same.

As shown in FIG. 2, a weatherproof film 10 of a photovoltaic module 201 according to Embodiment 2 is composed of a PET film 10a of about 50 μm thick, a silica ($SiO_2$-Δ) deposition layer 10b of about 20 μm thick, a PET film 10c of about 50 μm thick and a PPS film 10d of about 50 μm thick which are stacked in this order on the second sealing polymer layer 4 and integrated by dry lamination method.

That is, in the weatherproof film 10 of Embodiment 2, the thin aluminum film 5b utilized in the weatherproof film 5 of Embodiment 1 is replaced with the non-conductive silica deposition layer 10b, thereby eliminating the need for the insulating treatment to the portion through which the lead wire 6 is taken out.

Embodiment 3

Figure 3:
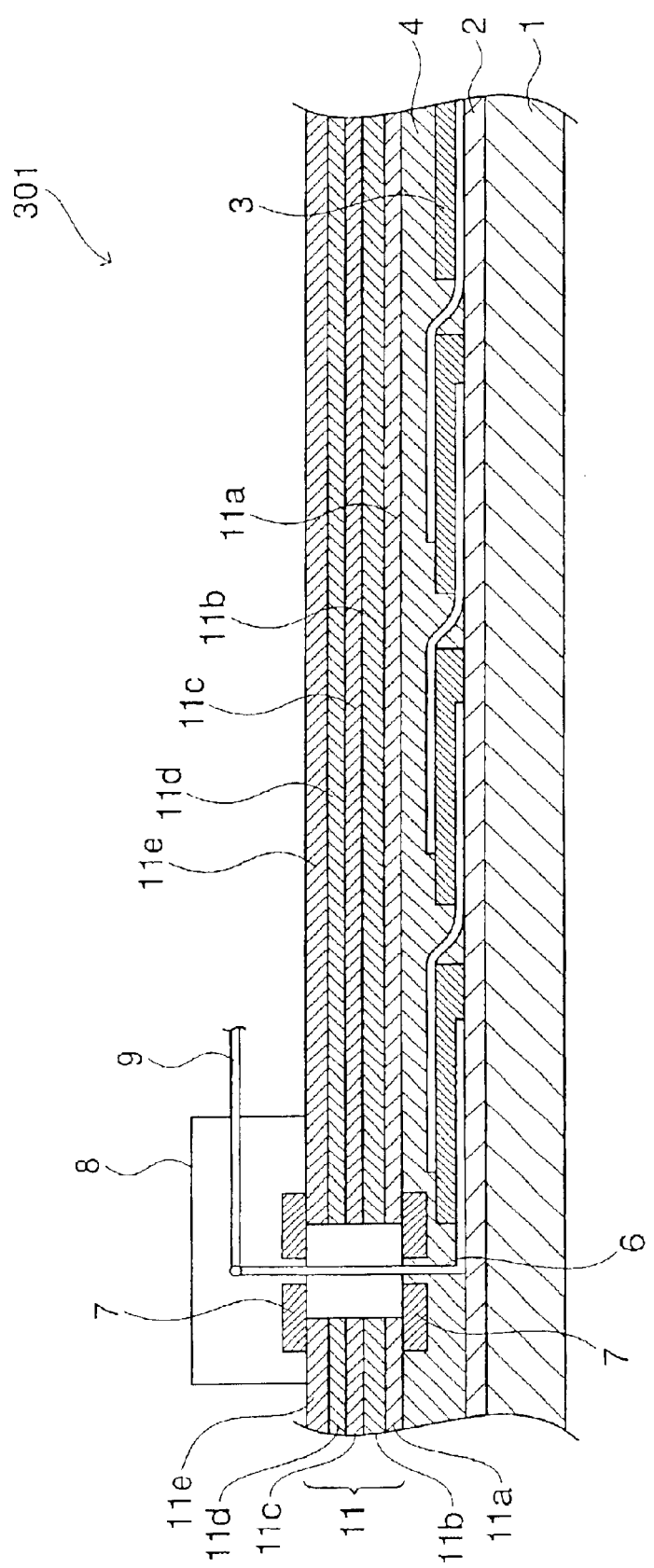
FIG. 3 is a sectional view illustrating a photovoltaic module according to Embodiment 3 of the present invention.

A photovoltaic module according to Embodiment 3 is described with reference to FIG. 3. FIG. 3 is a sectional view illustrating the photovoltaic module according to Embodiment 3.

Difference between the photovoltaic module of Embodiment 3 and that of Embodiment 1 (see FIG. 1) is only the structure of the weatherproof film and the other components are the same.

As shown in FIG. 3, a weatherproof film 11 of a photovoltaic module 301 according to Embodiment 3 is composed of a PET film 11a of about 50 μm thick, a thin aluminum film 11b of about 7 μm thick, a PET film 11c of about 50 μm thick, an EVA layer 11d of about 200 μm thick and a PPS film 11e of about 50 μm thick which are stacked in this order on the second sealing polymer layer 4.

There are two kinds of procedures for integrating the layers comprising the weatherproof film 11.

According to the first procedure, the PET film 11a, the thin aluminum film 11b and the PET film 11c, which constitute a conventional weatherproof film, are integrated in advance by dry lamination.

Then, the PPS film 11e is adhered to the PET film 11c via the EVA layer 11d.

According to the second procedure, the PET film 11a, the thin aluminum film 11b, the PET film 11c, the EVA layer 11d and the PPS film 11e are stacked and integrated by dry lamination in a single step.

According to the first procedure, the PPS film 11e is adhered as needed to the conventional weatherproof film, i.e., a laminate of the PET film 11a, the thin aluminum film 11b and the PET film 11c, via the EVA layer 11d. Thus, the weatherproof film which is resistant against poisonous gas and impermeable to vapor is obtained.

That is, during the manufacture step of the weatherproof film, the conventional weatherproof film which is impermeable to vapor can appropriately be changed to a weatherproof film having resistance against poisonous gas and vapor impermeability. Therefore, flexibility is given to the manufacture step.

Since the conductive thin aluminum film 11b is utilized as the moisture-proof layer in the weatherproof film 11, it is necessary to insulate a portion of the weatherproof film 11 by using Kapton rings to take out the lead wire 6 through the portion.

Embodiment 4

Figure 4:
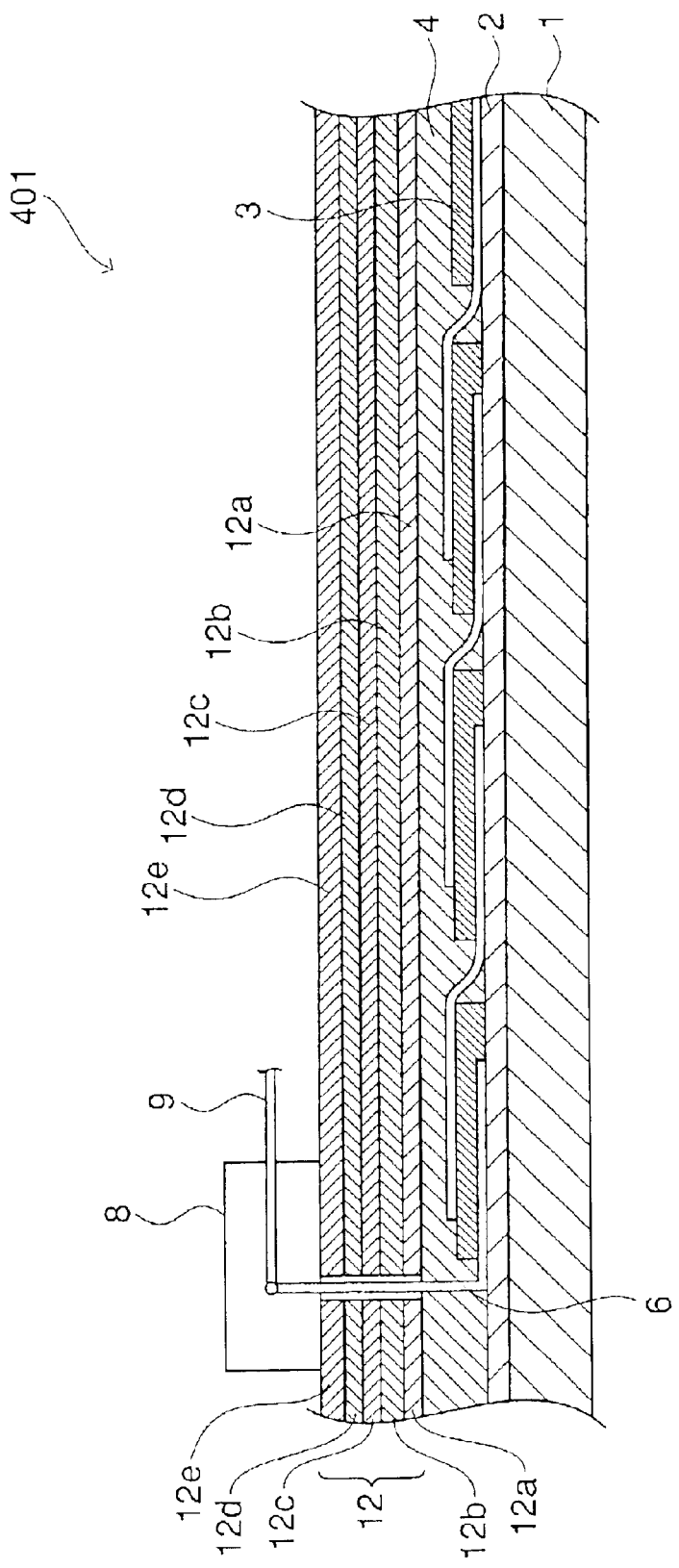
FIG. 4 is a sectional view illustrating a photovoltaic module according to Embodiment 4 of the present invention.

A photovoltaic module according to Embodiment 4 is described with reference to FIG. 4. FIG. 4 is a sectional view illustrating the photovoltaic module according to Embodiment 4.

Difference between the photovoltaic module of Embodiment 4 and that of Embodiment 1 (see FIG. 1) is only the structure of the weatherproof film and the other components are the same.

As shown in FIG. 4, a weatherproof film 12 of a photovoltaic module 401 according to Embodiment 4 is composed of a PET film 12a of about 50 μm thick, a silica ($SiO_2$-Δ) deposition layer 12b of about 20 μm thick, a PET film 12c of about 50 μm thick, an EVA layer 12d of about 200 μm thick and a PPS film 12e of about 50 μm thick which are stacked in this order on the second sealing polymer layer 4.

That is, in the weatherproof film 12 of Embodiment 4, the thin aluminum film 11b utilized in the weatherproof film 11 of Embodiment 3 is replaced with the non-conductive silica deposition layer 12b, thereby eliminating the need for the insulating treatment to the portion through which the lead wire 6 is taken out.

The integration of the layers comprising the weatherproof film 12 can be carried out by either of the two procedures described above in Embodiment 3.

Embodiment 5

Figure 5:
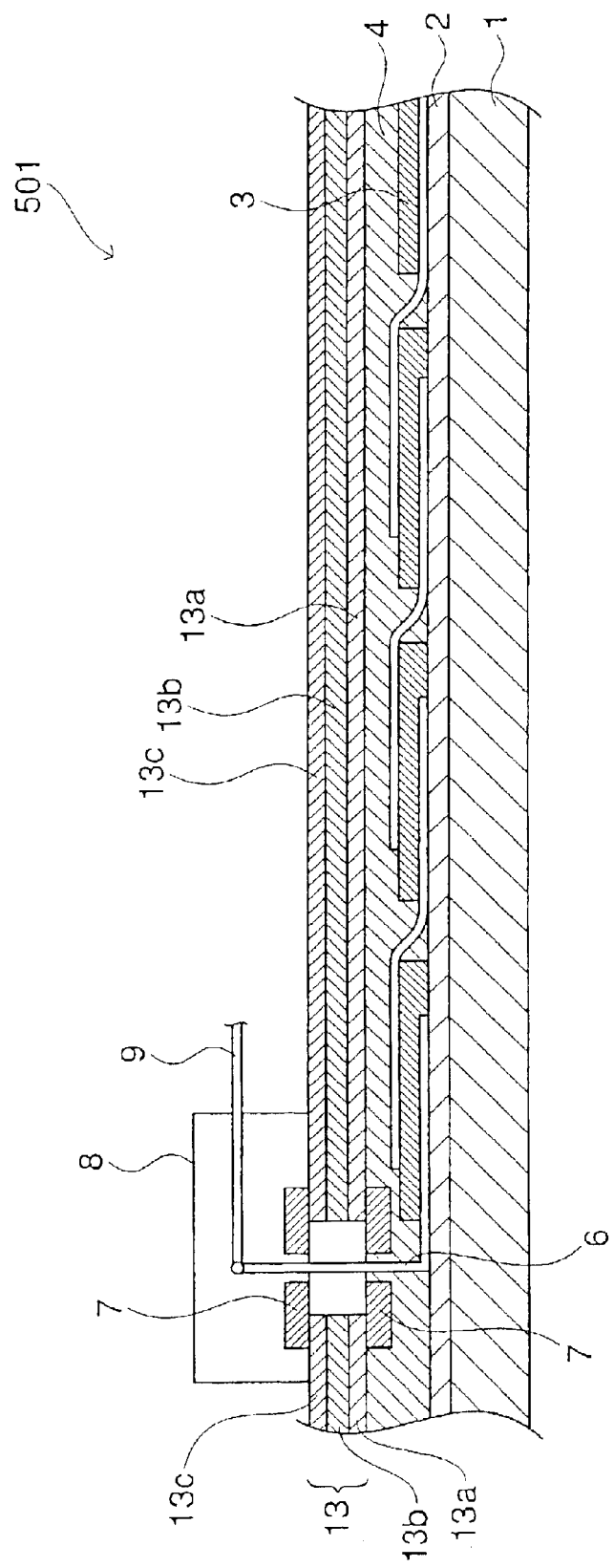
FIG. 5 is a sectional view illustrating a photovoltaic module according to Embodiment 5 of the present invention.

A photovoltaic module according to Embodiment 5 is described with reference to FIG. 5. FIG. 5 is a sectional view illustrating the photovoltaic module according to Embodiment 5.

Difference between the photovoltaic module of Embodiment 5 and that of Embodiment 1 (see FIG. 1) is only the structure of the weatherproof film and the other components are the same.

As shown in FIG. 5, a weatherproof film 13 of a photovoltaic module 501 according to Embodiment 5 is composed of a PPS film 13a of about 50 μm thick, a thin aluminum film 13b of about 7 μm thick and a PPS film 13c of about 50 μm thick which are stacked in this order on the second sealing polymer layer 4 and integrated by dry lamination method.

Since the PPS film only is utilized without using the PET film, the cost required for manufacturing the weatherproof film having the resistance against poisonous gas and the vapor impermeability can be minimized.

The surface of the PPS film 13a is preferably subjected to corona discharge treatment to improve adhesion with EVA comprising the second sealing polymer layer 4.

The weatherproof film 13 utilizes the conductive thin aluminum film 13b as the moisture-proof layer. Therefore, a portion of the weatherproof film 13 needs to be insulated by using Kapton rings to take out the lead wire 6 through the portion.

Embodiment 6

Figure 6:
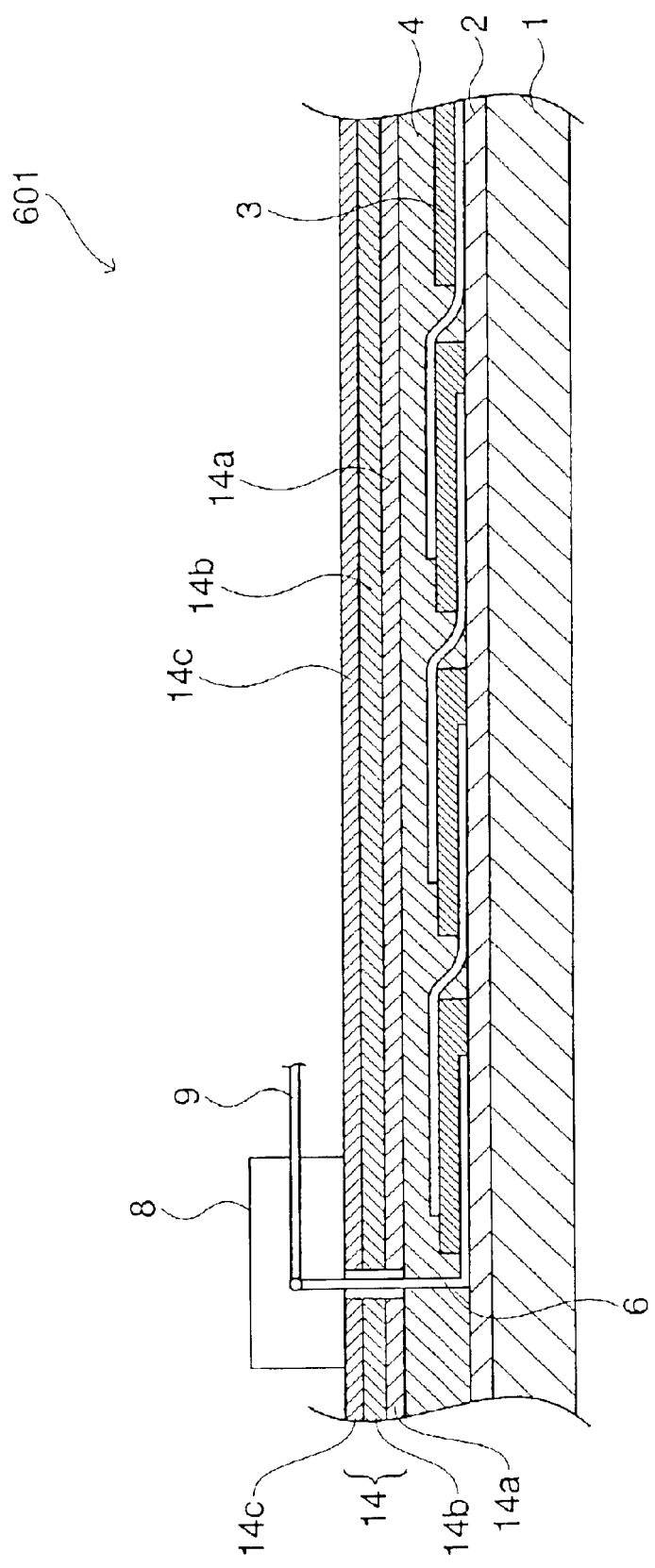
FIG. 6 is a sectional view illustrating a photovoltaic module according to Embodiment 6 of the present invention.

A photovoltaic module according to Embodiment 6 is described with reference to FIG. 6. FIG. 6 is a sectional view illustrating the photovoltaic module according to Embodiment 6.

Difference between the photovoltaic module of Embodiment 6 and that of Embodiment 1 (see FIG. 1) is only the structure of the weatherproof film and the other components are the same.

As shown in FIG. 6, a weatherproof film 14 of a photovoltaic module 601 according to Embodiment 6 is composed of a PPS film 14a of about 50 μm thick, a silica (SiO$_2$-Δ) deposition layer 14b of about 20 μm thick and a PPS film 14c of about 50 μm thick which are stacked in this order on the second sealing polymer layer 4 and integrated by dry lamination.

That is, in the weatherproof film 14 of Embodiment 6, the thin aluminum film 13b utilized in the weatherproof film 13 of Embodiment 5 is replaced with the non-conductive silica deposition layer 14b, thereby eliminating the need for the insulating treatment to the portion through which the lead wire 6 is taken out.

Embodiment 7

Figure 7:
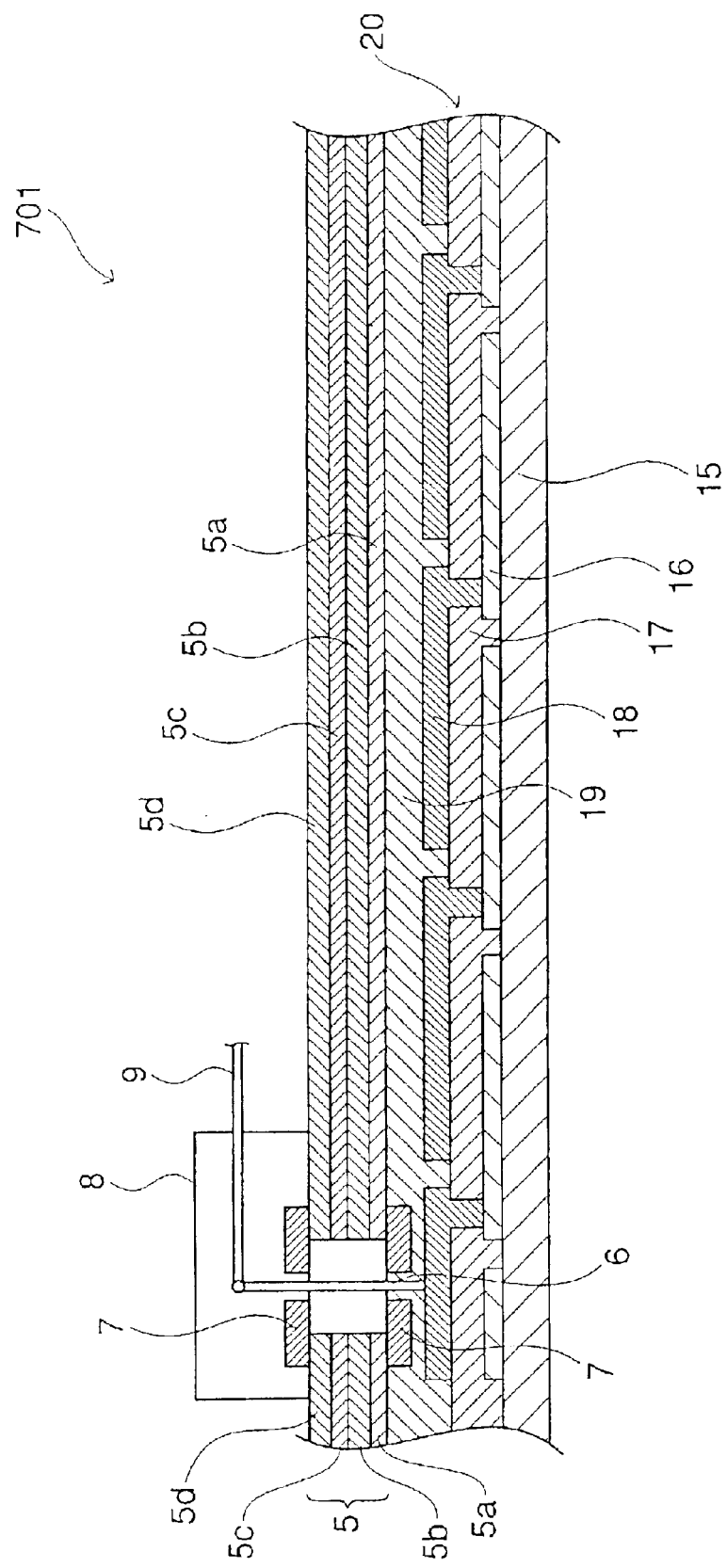
FIG. 7 is a sectional view illustrating a photovoltaic module according to Embodiment 7 of the present invention.

A photovoltaic module according to Embodiment 7 is described with reference to FIG. 7. FIG. 7 is a sectional view illustrating the photovoltaic module according to Embodiment 7.

As shown in FIG. 7, a photovoltaic module 701 according to Embodiment 7 includes a glass substrate 15, a light-transmissive first electrode layer 16 stacked on the glass substrate 15, a photoelectric conversion layer 17 stacked on the first electrode layer 16, a second electrode layer 18 stacked on the photoelectric conversion layer 17, a sealing polymer layer 19 stacked on the second electrode layer 18 and a weatherproof film 5 stacked on the sealing polymer layer 19. The weatherproof film 5 includes a thin aluminum film 5b provided on the sealing polymer layer 19 as a moisture-proof layer and a PPS film 5d provided on the thin aluminum film 5b as a gas-proof layer.

More specifically, as shown in FIG. 7, the photovoltaic module 701 utilizes white tempered glass of about 4.0 mm thick as the glass substrate 15.

On the glass substrate 15, the first electrode layer 16, the photoelectric conversion layer 17 and the second electrode layer 18 are stacked and patterned. Then, the first and second electrode layers 16 and 18 adjacent to each other are connected in series, respectively, to form an integrated thin film photovoltaic cell 20.

The first electrode layer 16 is a SnO$_2$ (or ZnO$_2$) thin film having a thickness of about 1 μm, the photoelectric conversion layer 17 is a laminate of P-type, I-type and N-type amorphous silicon layers stacked in this order and the second electrode layer 18 is a Ag thin film having a thickness of about 0.2 to 0.6 μm.

Then, EVA of about 0.4 mm thick is stacked as the sealing polymer layer 19 on the second electrode layer 18 and the weatherproof film 5 is stacked on the sealing polymer layer 19.

The weatherproof film 5 is composed of a PET film 5a of about 50 μm thick, a thin aluminum film 5b of about 7 μm thick, a PET film 5c of about 50 μm thick and a PPS film 5d of about 50 μm thick which are stacked in this order on the sealing polymer layer 19 and integrated by dry lamination.

Then, by a known sealing technique such as an autoclave method or a vacuum lamination method, all the stacked layers are integrated and a cross-linking reaction of EVA comprising the sealing polymer layer 19 is completed.

Thereafter, a frame (not shown) is attached to the photovoltaic module 701 by a conventional technique.

At this time, measures same as those which have conventionally been adopted against salt damage are taken. That is, a nonmetal washer is fitted to a tapping screw, an exposed portion of the tapping screw is sealed with a silicon polymer, a section of the frame is anodized and a gap between the photovoltaic module and the frame is filled with a silicon polymer.

In the final step, a lead wire 6 is taken out of the integrated thin film photovoltaic cell 20. Since the thin aluminum film 5b is utilized as the moisture-proof layer in the weatherproof film 5, a portion of the weatherproof film 5 through which the lead wire 6 will be taken out is insulated by using Kapton rings 7 before the lead wire 6 is taken out.

The thus taken-out lead wire 6 is introduced into a terminal box 8 and connected with an external output cable 9.

The thus manufactured super straight type photovoltaic module 701 does not cause electrolytic corrosion even if it is installed in the salt damage area. Further, the PPS film 5d protects the PET film 5c from poisonous gases such as hydrogen sulfide gas, chlorine gas, methylmercaptan, methyl sulfide and ammonia, so that the photovoltaic module 701 can be used without any characteristic deterioration even if it is placed in environments exposed to the poisonous gases or the poisonous gases and vapor.

Therefore, the photovoltaic module 701 can be installed in any places such as the salt damage areas, volcanic areas, hot spring areas and water purification and sewage treatment facilities.

According to the present invention, the weatherproof film is comprised of a gas-proof layer provided at the top and a moisture-proof layer provided below the gas-proof layer, and the gas-proof layer is made of polyphenylene sulfide. Therefore, the present invention provides a photovoltaic module which can be used without any characteristic deterioration even if it is installed in a place exposed to poisonous gases such as hydrogen sulfide gas, chlorine gas, methylmercaptan, methyl sulfide and ammonia.

What is claimed is:

1. A photovoltaic module comprising: a light-transmissive substrate; a first sealing polymer layer stacked on the substrate; a photovoltaic cell stacked on the first sealing polymer layer; a second sealing polymer layer stacked on the photovoltaic cell and a weatherproof film stacked on the second sealing polymer layer, wherein the weatherproof film includes a moisture-proof layer provided on the second sealing polymer layer and a gas-proof layer provided on the moisture-proof layer, the gas-proof layer comprising polyphenylene sulfide; and wherein the moisture-proof layer comprises aluminum or galvanized steel.

2. A photovoltaic module comprising:

a light-transmissive substrate; a first sealing polymer inclusive layer stacked on at least the substrate; a photovoltaic cell stacked on at least the first sealing polymer inclusive layer; a second sealing polymer inclusive layer stacked on at least the photovoltaic cell, and a weatherproof film stacked on at least the second sealing polymer inclusive layer, wherein the weatherproof film includes a moisture-proof layer provided on at least the second sealing polymer inclusive layer and a gas-proof layer provided over at least the moisture-proof layer, the gas-proof layer comprising polyphenylene sulfide, and wherein another layer comprising polyphenylene sulfide is located between at least the second sealing polymer inclusive layer and the moisture-proof layer.

3. A photovoltaic module comprising:

a light-transmissive substrate; a first sealing polymer inclusive layer stacked on at least the substrate; a photovoltaic cell stacked on at least the first sealing polymer inclusive layer; a second sealing polymer inclusive layer stacked on at least the photovoltaic cell, and a weatherproof film stacked on at least the second sealing polymer inclusive layer, wherein the weatherproof film includes a moisture-proof layer provided on at least the second sealing polymer inclusive layer and a gas-proof layer provided over at least the moisture-proof layer, the gas-proof layer comprising polyphenylene sulfide, and wherein the moisture-proof layer and the gas-proof layer are adhered by a layer comprising ethylene-vinylacetate copolymer sandwiched therebetween.

4. A photovoltaic module comprising:

a light-transmissive substrate; a first sealing polymer inclusive layer stacked on at least the substrate; a photovoltaic cell stacked on at least the first sealing polymer inclusive layer; a second sealing polymer inclusive layer stacked on at least the photovoltaic cell, and a weatherproof film stacked on at least the second sealing polymer inclusive layer, wherein the weatherproof film includes a moisture-proof layer provided on at least the second sealing polymer inclusive layer and a gas-proof layer provided over at least the moisture-proof layer, the gas-proof layer comprising polyphenylene sulfide, and wherein the moisture-proof layer further provides polyethylene terephthalate layers on both surfaces thereof.

5. A photovoltaic module comprising: a light-transmissive substrate; a light-transmissive first electrode layer stacked on the substrate; a photoelectric conversion layer stacked on the first electrode layer; a second electrode layer stacked on the photoelectric conversion layer; a sealing polymer layer stacked on the second electrode layer and a weatherproof film stacked on the sealing polymer layer, wherein the weatherproof film includes a moisture-proof layer provided on the sealing polymer layer and a gas-proof layer provided on the moisture-proof layer, the gas-proof layer being made of polyphenylene sulfide.

6. A photovoltaic module according to claim 5, wherein the moisture-proof layer is made of a metal or an inorganic oxide.

7. A photovoltaic module according to claim 5, wherein the moisture-proof layer is made of silica, titania or zirconia.

* * * * *